United States Patent
Jo et al.

(10) Patent No.: US 10,515,675 B2
(45) Date of Patent: Dec. 24, 2019

(54) MEMORY DEVICE, OPERATING METHOD THEREOF, AND OPERATING METHOD OF MEMORY SYSTEM INCLUDING THE SAME

(71) Applicant: SK hynix Inc., Gyeonggi-do (KR)

(72) Inventors: Sang-Gu Jo, Gyeonggi-do (KR); Sung-Eun Lee, Gyeonggi-do (KR); Jung-Hyun Kwon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/650,460

(22) Filed: Jul. 14, 2017

(65) Prior Publication Data

US 2018/0151205 A1  May 31, 2018

(30) Foreign Application Priority Data

Nov. 30, 2016  (KR) .................. 10-2016-0161476

(51) Int. Cl.
| | | |
|---|---|---|
| *G11C 7/22* | (2006.01) | |
| *G11C 11/4093* | (2006.01) | |
| *G11C 11/4076* | (2006.01) | |
| *G11C 11/4096* | (2006.01) | |
| *G11C 7/10* | (2006.01) | |
| *G11C 5/06* | (2006.01) | |

(52) U.S. Cl.
CPC .............. *G11C 7/22* (2013.01); *G11C 7/222* (2013.01); *G11C 11/4076* (2013.01); *G11C 11/4093* (2013.01); *G11C 11/4096* (2013.01); *G11C 5/066* (2013.01); *G11C 7/1006* (2013.01); *G11C 7/1051* (2013.01); *G11C 7/1084* (2013.01)

(58) Field of Classification Search
CPC ....................................................... G11C 7/22
USPC ...................................................... 365/189.011
See application file for complete search history.

(56) References Cited

U.S. PATENT DOCUMENTS

| | | | |
|---|---|---|---|
| 6,498,766 B2 | 12/2002 | Lee et al. | |
| 6,922,367 B2 * | 7/2005 | Morzano | G11C 7/1066 365/193 |
| 7,385,861 B1 * | 6/2008 | Zhu | G06F 13/4243 365/194 |
| 7,613,346 B2 * | 11/2009 | Hunkins | G06F 3/14 382/232 |
| 7,715,251 B2 * | 5/2010 | Wilson | G11C 7/22 365/154 |
| 8,072,826 B2 | 12/2011 | Chang | |
| 9,384,795 B1 * | 7/2016 | Hoff | G11C 7/10 |
| 2004/0022095 A1 * | 2/2004 | Lee | G11C 7/10 365/200 |

(Continued)

OTHER PUBLICATIONS

Office Action issued by the United States Patent and Trademark Office for U.S. Appl. No. 16/567,330 dated Oct. 3, 2019.

*Primary Examiner* — Amir Zarabian
*Assistant Examiner* — Muna A Techane
(74) *Attorney, Agent, or Firm* — IP & T Group LLP

(57) ABSTRACT

A method for operating a memory device includes: receiving a write command; checking out whether a data strobe signal toggles or not after a given time passes from a moment when the write command is received; when the data strobe signal is checked out to be maintained at a uniform level, detecting voltage levels of a plurality of data pads; and performing an operation that is selected based on the voltage levels of the plurality of the data pads among a plurality of predetermined operations.

10 Claims, 4 Drawing Sheets

(56) References Cited

U.S. PATENT DOCUMENTS

| | | | |
|---|---|---|---|
| 2005/0237851 A1* | 10/2005 | Ware | G11C 7/1039 |
| | | | 365/189.07 |
| 2008/0005493 A1 | 1/2008 | Chung et al. | |
| 2009/0044039 A1* | 2/2009 | Lee | G11C 7/1051 |
| | | | 713/600 |
| 2011/0188619 A1* | 8/2011 | Sugioka | G06F 1/10 |
| | | | 375/354 |
| 2012/0117317 A1 | 5/2012 | Sheffler et al. | |
| 2012/0218834 A1 | 8/2012 | Kim | |
| 2015/0067444 A1 | 3/2015 | Eguchi et al. | |
| 2016/0216325 A1 | 7/2016 | Kim et al. | |
| 2017/0004869 A1 | 1/2017 | Shin et al. | |

* cited by examiner

MEMORY DEVICE, OPERATING METHOD THEREOF, AND OPERATING METHOD OF MEMORY SYSTEM INCLUDING THE SAME

CROSS-REFERENCE TO RELATED APPLICATIONS

The present application claims priority of Korean Patent Application No. 10-2016-0161476, filed on Nov. 30, 2016, which is incorporated herein by reference in its entirety.

BACKGROUND

1. Field

Exemplary embodiments of the present invention relate to a memory device and a memory system including the memory device.

2. Description of the Related Art

A memory device may be programmed not only with data of random patterns but also with data of particular patterns for diverse purposes, such as test and training. Writing the data of particular patterns which are frequently written in a memory device through a simpler, more efficient process, would be advantageous and would also reduce the power consumption of the memory device.

SUMMARY

Embodiments of the present invention are directed to a semiconductor technology and a method that allow writing data in a memory device in a simpler and more efficient manner. The present invention is particularly suitable for writing data having particular patterns which are frequently written in a memory device. The technology may reduce the power requirements of semiconductor devices such as semiconductor memory devices and memory systems employing semiconductor memory devices.

In accordance with an embodiment of the present invention, a method for operating a memory device includes: receiving a write command; checking out whether a data strobe signal toggles or maintains a uniform level after a given time passes from a moment when the write command is received; when the data strobe signal maintains the uniform level, detecting voltage levels of a plurality of data pads; and performing an operation that is selected based on the voltage levels of the plurality of the data pads, from a plurality of predetermined operations.

The plurality of the predetermined operations may include an operation of writing a data pattern that is selected based on the voltage levels of the plurality of the data pads, from a plurality of data patterns, in the memory device.

The plurality of the predetermined operations may include an operation of reading a data from a selected region, inverting the read data to produce an inverted read data, and re-writing the inverted read data in the selected region.

The method may further include: when the data strobe signal toggles, writing data received through the plurality of the data pads in the memory device in synchronization with the data strobe signal.

When the data strobe signal maintains the uniform level, the voltage levels of the plurality of the data pads may be fixed for at least two or more clock cycles after the given time passes from the moment when the write command is received.

The given time may include a write latency.

In accordance with another embodiment of the present invention, a method for operating a memory system includes: transferring a write command from a memory controller to a memory device; transferring a data strobe signal of a fixed level from the memory controller to the memory device after a given time passes from a moment when the write command is transferred; the memory controller fixing voltage levels of data lines at for at least two or more clock cycles after the given time passes from the moment when the write command is transferred; and the memory device performing an operation that is selected based on the voltage levels of the data lines, from a plurality of predetermined operations.

The plurality of the predetermined operations may include an operation of writing a data pattern that is selected based on the voltage levels of the plurality of data lines, from a plurality of data patterns, in the memory device.

The plurality of the predetermined operations may include an operation of reading a data from a region that is selected in the memory device, inverting the read data to produce an inverted read data, and re-writing the inverted read data in the selected region.

The given time may include a write latency.

In accordance with yet another embodiment of the present invention, a memory device includes: a strobe toggle sensing circuit suitable for sensing whether a data strobe signal toggles or not at a moment when a data is supposed to be received; a serial-to-parallel converting circuit suitable for, when a toggling of the data strobe signal is sensed, performing a serial-to-parallel conversion onto data that are received through a plurality of data pads to produce parallel data, and transferring the parallel data to a memory core; and a pattern generating circuit suitable for, when the toggling of the data strobe signal is not sensed, transferring a data pattern that is selected based on voltage levels of the plurality of the data pads, from a plurality of data patterns, to the memory core.

The strobe toggle sensing circuit may apply the data strobe signal as an input strobe signal when the toggling of the data strobe signal is sensed, and applies a clock as the input strobe signal when the toggling of the data strobe signal is not sensed.

The memory device may further include: a plurality of data receiving circuits suitable for receiving data from the plurality of the data pads in synchronization with the input strobe signal.

The memory device may further include: a clock receiving circuit suitable for receiving the clock.

The strobe toggle sensing circuit may sense whether the data strobe signal toggles or not at a moment after a given time passes from a write command.

The given time may include a write latency.

In accordance with yet another embodiment of the present invention, a memory system includes: a memory device; and a memory controller suitable for controlling the memory device, wherein the memory device comprises: a strobe toggle sensing circuit suitable for sensing whether a data strobe signal transferred from the memory controller toggles or not at a moment when a data is supposed to be received; a serial-to-parallel converting circuit suitable for, when a toggling of the data strobe signal is sensed, performing a serial-to-parallel conversion onto data that are transferred from the memory controller through a plurality of data pads to produce parallel data, and transferring the parallel data to a memory core; and a pattern generating circuit suitable for, when the toggling of the data strobe signal is not sensed, transferring a data pattern that is selected based on voltage levels of the plurality of the data pads, from a plurality of data patterns, to the memory core.

DETAILED DESCRIPTION

Figure 1:
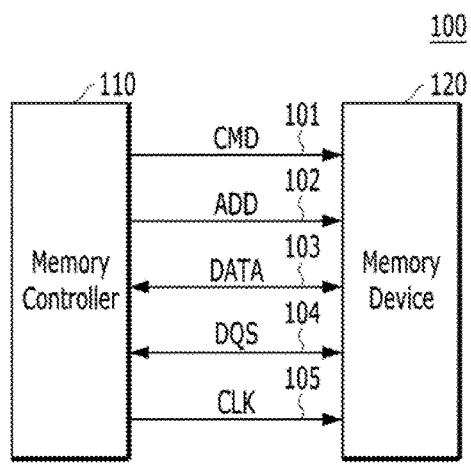
FIG. 1 is a block diagram illustrating a memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 illustrates a memory system 100 in accordance with an embodiment of the present invention.

Referring to FIG. 1, the memory system 100 may include a memory controller 110 and a memory device 120 operatively coupled to each other.

The memory controller 110 may control an operation of the memory device 120, such as a read operation and a write operation, in response to a request from a host (not shown). The memory controller 110 may transfer a command CMD to the memory device 120 through a command bus 101, transfer an address ADD to the memory device 120 through an address bus 102, and transfer data DATA to and/or from the memory device 120 through a data bus 103. Also, a data strobe signal DQS may be transferred/received through a data strobe signal transfer line 104 for synchronization of the data DATA that are transferred/received through the data bus 103. The memory controller 110 may transfer a clock CLK to the memory device 120 through a clock transfer line 105.

Each of the command bus 101, the address bus 102, and the data bus 103 may include a plurality of lines.

The memory device 120 may be controlled based on the command CMD and the address ADD that are transferred from the memory controller 110, and may perform a read operation by transferring the data DATA read from the memory device to the memory controller 110. The memory device 120 may also be controlled based on the command CMD and the address ADD that are transferred from the memory controller 110, and may perform a write operation by storing the data DATA received from the memory controller 110 in a memory location specified by the received address.

Figure 2:
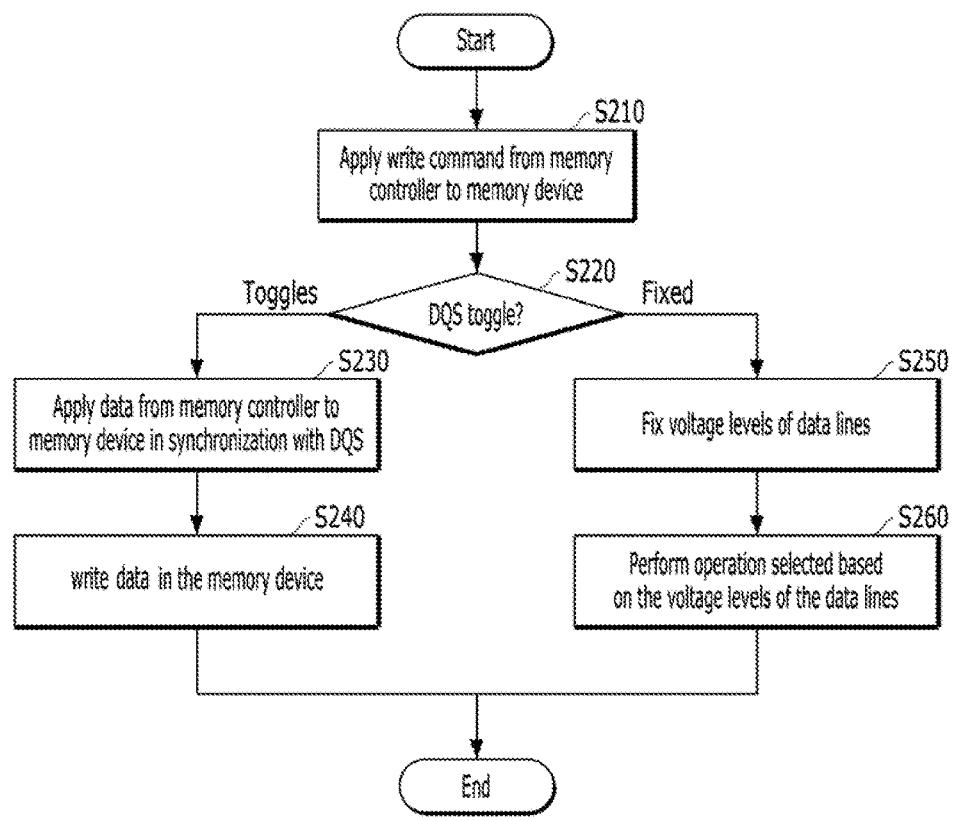
FIG. 2 is a flowchart describing a write operation of the memory system in accordance with an embodiment of the present invention.

FIG. 2 is a flowchart describing a write operation of the memory system 100 in accordance with an embodiment of the present invention.

Referring to FIG. 2, in step S210, a write command WR may be applied from the memory controller 110 to the memory device 120. Although not illustrated herein, the address ADD for selecting a region of a memory core of the memory device 120 where a write operation is to be performed may be applied from the memory controller 110 to the memory device 120 along with the write command WR.

In step S220, it is checked whether the data strobe signal DQS toggles or the data strobe signal DQS gets fixed at a uniform level within a time period equal to the write latency WL from a moment when the write command WR is applied. The write latency WL time period may typically equal to a clock cycle delay between the write command WR and the data DATA.

After a time period equal to the write latency WL passes from the moment when the write command WR is applied, when the memory controller 110 toggles the data strobe signal DQS ('Toggle' at the step S220), a general write operation may be performed.

In step S230, the data DATA may be transferred from the memory controller 110 to the memory device 120 in synchronization with the toggling data strobe signal DQS.

In step S240, the memory device 120 may write the data DATA in the memory core of the memory device.

After a time period equal to the write latency WL passes from the moment when the write command WR is applied, when the memory controller 110 fixes the data strobe signal DQS ('Fixed' at the step S220), another operation different from the general write operation may be performed.

In this case, in step S250, the memory controller 110 may fix the voltage levels of the data lines of the data bus 103 at a uniform level. The voltage levels of the data lines of the data bus 103 may be fixed at the uniform level during a time period of at least two clock cycles, or more specifically, for a time period necessary for transmitting data equal to a data burst length BL. The subsequent operation may differ according to the voltage level of each of the data lines included in the data bus 103.

In step S260, the memory device 120 may perform an operation that is selected based on the voltage levels of the data lines, from a plurality of predetermined operations. For example, when there are eight data lines, the operation that is performed when the eight data lines are all fixed at a level of '0' may be different from the operation that is performed when seven data lines are fixed at the level of '0' and one data line is fixed at a level of '1'.

Figure 3:
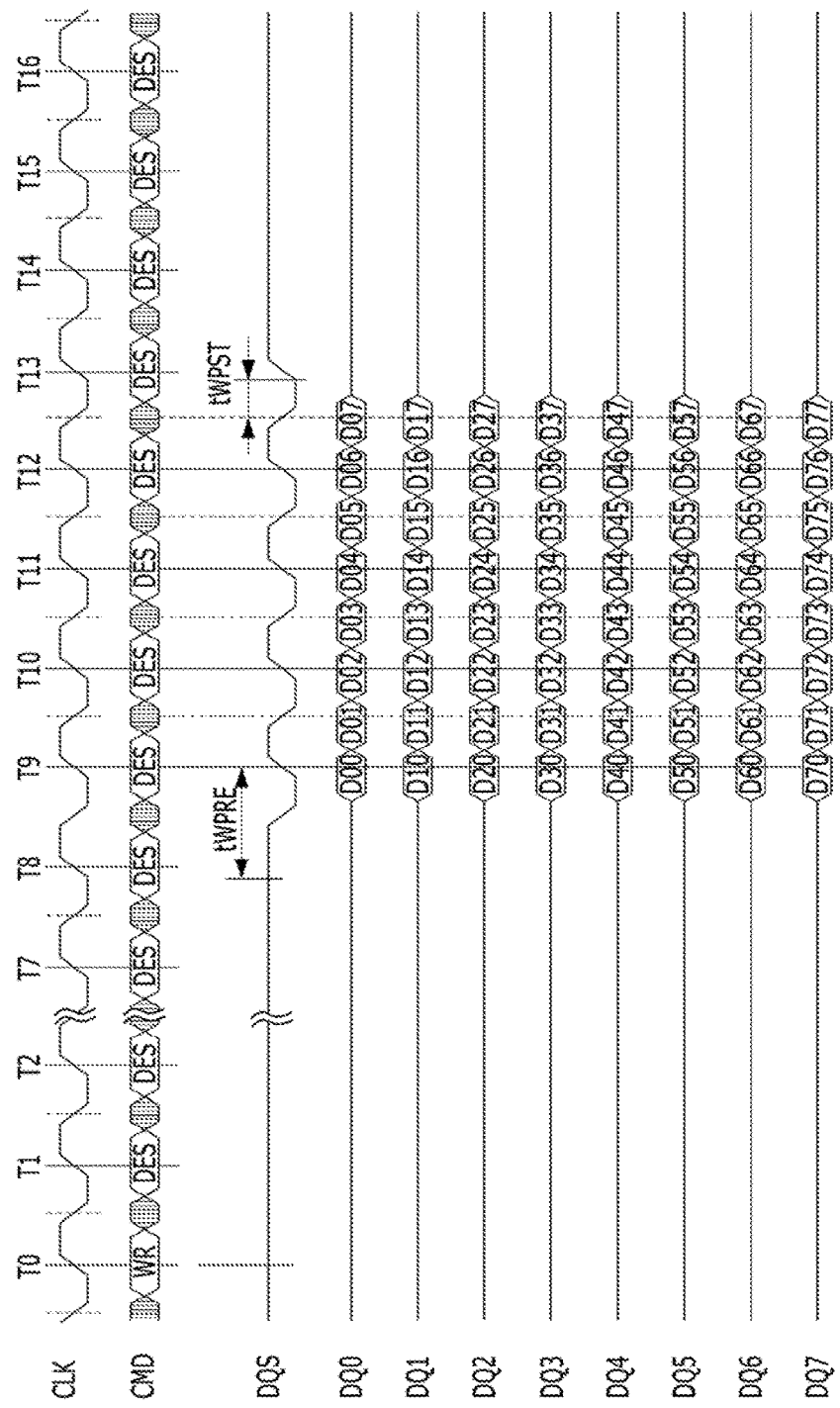
FIG. 3 is a timing diagram illustrating an operation of steps shown in FIG. 2.

FIG. 3 is a timing diagram illustrating an operation of steps S210, S220, S230 and S240 shown in FIG. 2.

Referring to FIG. 3, the write command WR may be applied to the memory device 120 at a moment T0. Although not illustrated herein, the address ADD for selecting a region where a write operation is to be performed may be applied along with the write command WR.

At a moment T9 after the write latency WL, e.g., 9 clock cycles, passes from the moment T0, the data strobe signal DQS may toggle. From the moment T9, data D00 to D007, D10 to D17, D20 to D27, D30 to D37, D40 to D47, D50 to D057, D60 to D67, and D70 to D77 may be applied from data pads DQ0 to DQ7 coupled to the data lines of the data bus 103 to the memory device 120 in synchronization with the data strobe signal DQS.

From the moment T9, the data applied to the memory device 120 may be written in the memory core of the memory device 120.

In FIG. 3, "tWPRE" may represent a preamble of the data strobe signal DQS, and "tWPST" may represent a postamble of the data strobe signal DQS. Also, "DES" may represent a deselect signal indicating that no command is applied.

Figure 4:
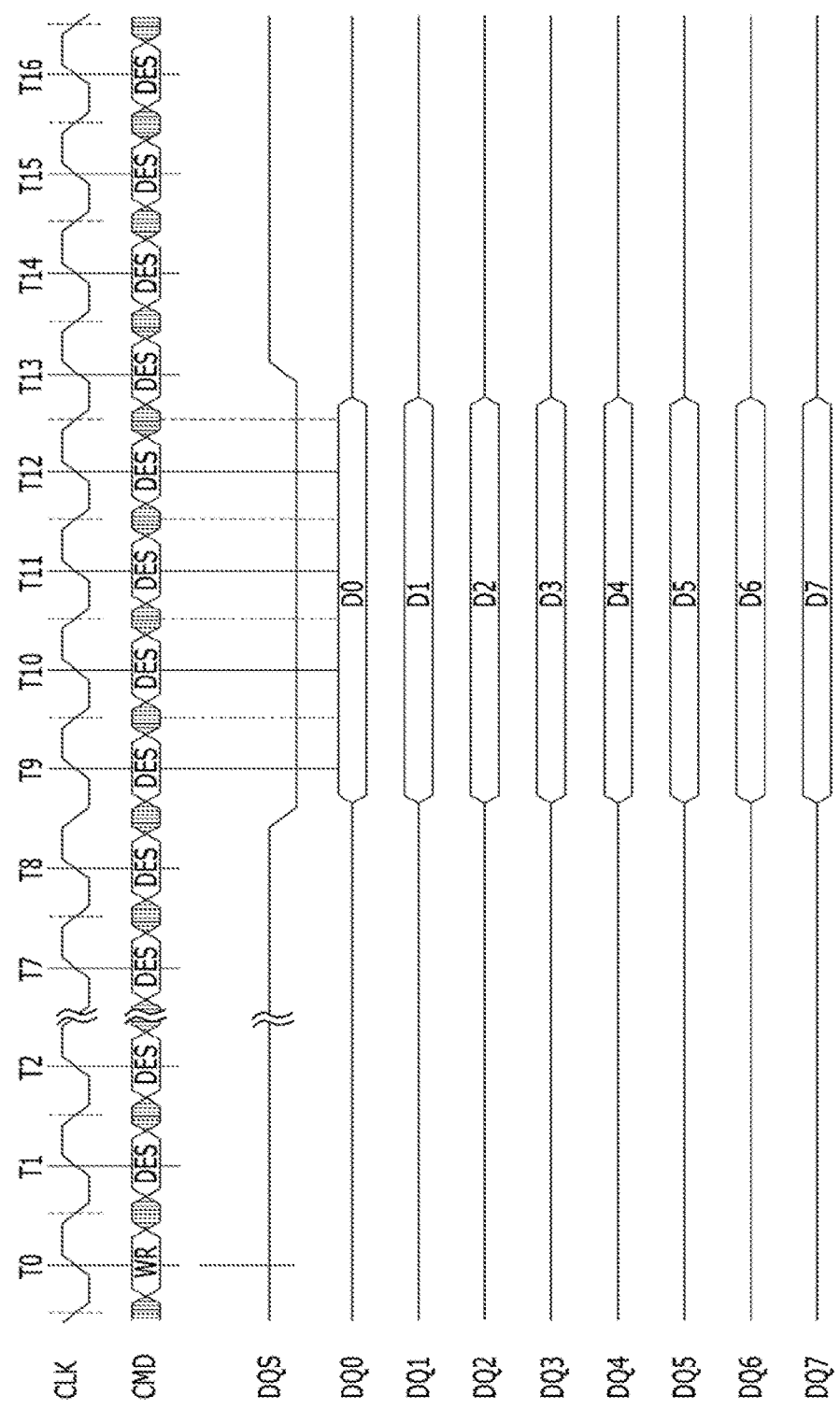
FIG. 4 is a timing diagram illustrating an operation of steps shown in FIG. 2.

FIG. 4 is a timing diagram illustrating an operation of steps S210, S220, S250 and S260 shown in FIG. 2.

Referring to FIG. 4, the write command WR may be applied to the memory device 120 at a moment T0. Although not illustrated herein, the address ADD for selecting a region where a write operation is to be performed may be applied to the memory device 120 along with the write command WR.

At a moment T9 after the write latency WL passes from the moment T0, the data strobe signal DQS does not toggle but instead is fixed at a level of '0'. Also, voltage levels D0 to D7 of the data pads DQ0 to DQ7 are fixed for a predetermined time. The predetermined time may correspond to a time period of at least two clock cycles, or more specifically, to a time period equal to the time necessary to transmit a data burst length BL, e.g., 4 clock cycles (2 data is transferred in one clock cycle)

The memory device 120 may perform subsequent operations directed by the fixed voltage levels D0 to D7 of the data pads DQ0 to DQ7.

The following Table 1 may represent the operations that are performed based on the voltage levels.

TABLE 1

| Operation | D7 | D6 | D5 | D4 | D3 | D2 | D1 | D0 |
|---|---|---|---|---|---|---|---|---|
| '0000 . . . 0000' Write | 0 | 0 | 0 | 0 | 0 | 0 | 0 | 0 |
| '1111 . . . 1111' Write | 0 | 0 | 0 | 0 | 0 | 0 | 0 | 1 |
| '0101 . . . 0101' Write | 0 | 0 | 0 | 0 | 0 | 0 | 1 | 0 |
| '1010 . . . 1010' Write | 0 | 0 | 0 | 0 | 0 | 0 | 1 | 1 |
| '0011 . . . 0011' Write | 0 | 0 | 0 | 0 | 0 | 1 | 0 | 0 |
| '1100 . . . 1100' Write | 0 | 0 | 0 | 0 | 0 | 1 | 0 | 1 |
| . . . | . . . | . . . | . . . | . . . | . . . | . . . | . . . | . . . |
| Read and then re-write after inverting read data | 1 | 1 | 1 | 1 | 1 | 1 | 1 | 1 |

Referring to Table 1, when the voltage levels D0 to D7 have a value of '0' in a decimal number, it may be seen that a 64-bit data all having a value of '0' is written in a region that is selected based on the address. Also, when the voltage levels D0 to D7 have a value of '4' in a decimal number, it may be seen that a 64-bit data having a pattern of '0011 . . . 0011' is written in a region that is selected based on the address. Also, when the voltage levels D0 to D7 have a value of '255' in a decimal number, it may be seen that a data of the region that is selected based on the address is read and the read data is inverted and re-written back into the region.

When the data strobe signal DQS is fixed after the write latency WL passes from the moment when the write command WR is applied, it may be seen from FIG. 4 and Table 1 that the operation selected based on the voltage levels of the data pads DQ0 to DQ7 is performed on the memory device 120. In this case, diverse patterns of data may be written or diverse operations may be performed while not making the data strobe signal DQS and the data toggle. Therefore, the amount of current consumed in the memory system 100 may be reduced.

Figure 5:
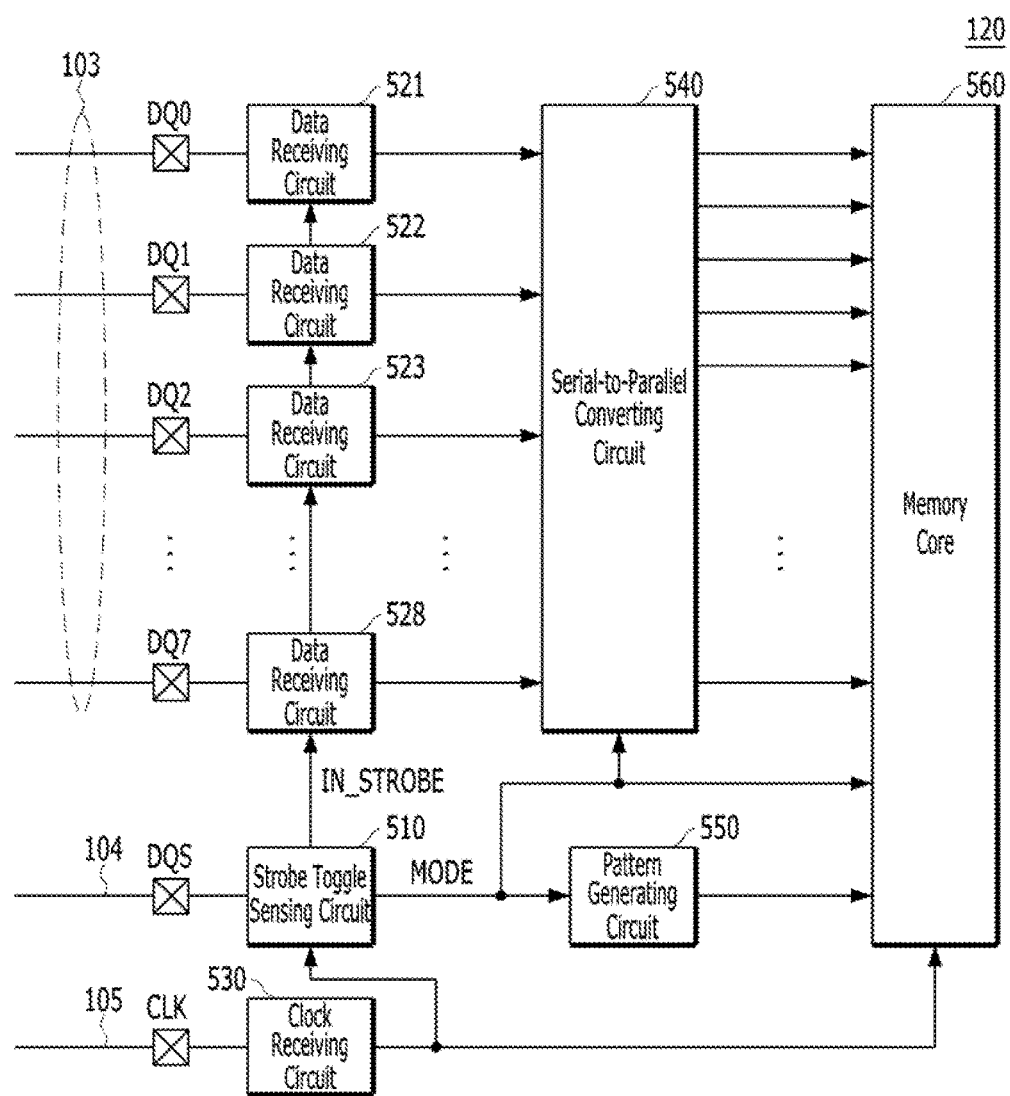
FIG. 5 is a block diagram illustrating an exemplary configuration of the memory device shown in FIG. 1.

FIG. 5 is a block diagram illustrating the memory device 120 shown in FIG. 1. Herein, constituent elements for performing different operations based on whether the data strobe signal DQS toggles or not in the memory device 120 may be described.

Referring to FIG. 5, the memory device 120 may include a strobe toggle sensing circuit 510, a plurality of data receiving circuits 521 to 528, a clock receiving circuit 530, a serial-to-parallel converting circuit 540, a pattern generating circuit 550, and a memory core 560.

The strobe toggle sensing circuit 510 may sense whether the data strobe signal DQS toggles or not at a moment when a data is supposed to be received, in other words, at a moment after the write latency WL passes from the moment when the write command WR is applied. The strobe toggle sensing circuit 510 may disable a mode signal MODE when the data strobe signal DQS toggles, and enable the mode signal MODE when the data strobe signal DQS does not toggle. Also, when the data strobe signal DQS toggles, the strobe toggle sensing circuit 510 may apply the data strobe signal DQS as an input strobe signal IN_STROBE. When the data strobe signal DQS does not toggle, the strobe toggle sensing circuit 510 may apply a clock CLK as the input strobe signal IN_STROBE.

The clock receiving circuit 530 may receive the clock CLK and apply the received clock CLK to the strobe toggle sensing circuit 510 and the memory core 560. The memory core 560 may perform an operation in synchronization with the clock CLK.

The data receiving circuits 521 to 528 may receive data from the data pads DQ0 to DQ7 in synchronization with the input strobe signal IN_STROBE. When the data strobe signal DQS toggles, the data receiving circuits 521 to 528 may receive the data in synchronization with the input strobe signal IN_STROBE corresponding to the data strobe signal DQS. When the data strobe signal DQS does not toggle, the data receiving circuits 521 to 528 may receive the data in synchronization with the input strobe signal IN_STROBE corresponding to the clock CLK.

The serial-to-parallel converting circuit 540 may be enabled and operate when the mode signal MODE is disabled. The serial-to-parallel converting circuit 540 may perform a serial-to-parallel conversion onto the 64-bit data inputted through the data receiving circuits 521 to 528 so as to produce parallel data and transfer the parallel data to the memory core 560. When the mode signal MODE is disabled, the parallel data transferred from the serial-to-parallel converting circuit 540 may be written in the region that is selected based on the address in the memory core 560.

The pattern generating circuit 550 may be enabled and perform an operation when the mode signal MODE is enabled. The pattern generating circuit 550 may transfer a pattern that is selected based on the voltage levels of the data pads DQ0 to DQ7 which are received in the data receiving circuits 521 to 528, from a plurality of data patterns, to the memory core 560. Based on Table 1, the relationship between the voltage levels of the data pads DQ0 to DQ7 and the selected data pattern may be determined. When the mode signal MODE is enabled, the data transferred from the pattern generating circuit 550 may be written in the region that is selected based on the address in the memory core 560.

According to the embodiments of the present invention, data of particular patterns may be written more simply in a more efficient manner in a memory device and may also reduce power requirement for the memory device, While the present invention has been described with respect to the specific embodiments, it will be apparent to those skilled in the art that various changes and modifications may be made without departing from the spirit and scope of the invention as defined in the following claims.

What is claimed is:

1. A memory device comprising:
    a strobe toggle sensing circuit suitable for sensing whether or not a data strobe signal toggles when data is received within a time period equal to a write latency from when a write command is applied;
    a serial-to-parallel converting circuit suitable for, when a toggling of the data strobe signal is sensed, performing a serial-to-parallel conversion onto data that are received through a plurality of data pads to produce parallel data, and transferring the parallel data to a memory core; and
    a pattern generating circuit suitable for, when the toggling of the data strobe signal is not sensed, transferring a data pattern that is selected based on voltage levels of the plurality of the data pads, from a plurality of data patterns, to the memory core.

2. The memory device of claim 1, wherein the strobe toggle sensing circuit applies the data strobe signal as an input strobe signal when the toggling of the data strobe signal is sensed, and applies a clock as the input strobe signal when the toggling of the data strobe signal is not sensed.

3. The memory device of claim 2, further comprising:
    a plurality of data receiving circuits suitable for receiving data from the plurality of the data pads in synchronization with the input strobe signal.

4. The memory device of claim 3, further comprising:
    a clock receiving circuit suitable for receiving the clock.

5. The memory device of claim 1, wherein the strobe toggle sensing circuit senses whether or not the data strobe signal toggles after a given time passes from the write command.

6. The memory device of claim 5, wherein the given time includes a write latency.

7. A memory system comprising:
    a memory device; and
    a memory controller suitable for controlling the memory device,
    wherein the memory device comprises:
        a strobe toggle sensing circuit suitable for sensing whether or not a data strobe signal transferred from the memory controller toggles when data is received within a time period equal to a write latency from when a write command is applied;
        a serial-to-parallel converting circuit suitable for, when a toggling of the data strobe signal is sensed, performing a serial-to-parallel conversion onto data that are transferred from the memory controller through a plurality of data pads to produce parallel data, and transferring the parallel data to a memory core; and
    a pattern generating circuit suitable for, when the toggling of the data strobe signal is not sensed, transferring a data pattern that is selected based on voltage levels of the plurality of the data pads, from a plurality of data patterns, to the memory core.

8. The memory system of claim 7, wherein the strobe toggle sensing circuit applies the data strobe signal as an input strobe signal when the toggling of the data strobe signal is sensed, and applies a clock as the input strobe signal when the toggling of the data strobe signal is not sensed, and
    wherein the memory device further comprises:
        a plurality of data receiving circuits suitable for receiving data from the plurality of the data pads in synchronization with the input strobe signal.

9. The memory system of claim 7, wherein the strobe toggle sensing circuit senses whether or not the data strobe signal toggles after a given time passes from the write command.

10. The memory system of claim 9, wherein the given time includes a write latency.

* * * * *